United States Patent
Matsuura et al.

(10) Patent No.: US 9,214,599 B2
(45) Date of Patent: Dec. 15, 2015

(54) LIGHT-EMITTING DEVICE

(71) Applicant: TOYODA GOSEI CO., LTD., Kiyosu-shi (JP)

(72) Inventors: Kenichi Matsuura, Kiyosu (JP); Hitoshi Omori, Kiyosu (JP)

(73) Assignee: TOYODA GOSEI CO., LTD., Kiyosu-Shi, Aichi-Ken (JP)

( * ) Notice: Subject to any disclaimer, the term of this patent is extended or adjusted under 35 U.S.C. 154(b) by 0 days.

(21) Appl. No.: 13/705,096

(22) Filed: Dec. 4, 2012

(65) Prior Publication Data

US 2013/0161660 A1 Jun. 27, 2013

(30) Foreign Application Priority Data

Dec. 26, 2011 (JP) ................. 2011-284432

(51) Int. Cl.
  *H01L 33/50* (2010.01)
  *H01L 33/08* (2010.01)
  *H01L 25/075* (2006.01)

(52) U.S. Cl.
  CPC ............ *H01L 33/08* (2013.01); *H01L 25/0753* (2013.01)

(58) Field of Classification Search
  CPC .............................. H01L 27/15; H01L 33/504
  USPC ..................................................... 257/79, 99
  See application file for complete search history.

(56) References Cited

U.S. PATENT DOCUMENTS

| | | | |
|---|---|---|---|
| 7,696,522 B2 * | 4/2010 | Ono et al. ...................... | 257/88 |
| 8,012,774 B2 * | 9/2011 | Tran et al. ..................... | 438/22 |
| 8,132,934 B2 | 3/2012 | An | |
| 2005/0110036 A1 * | 5/2005 | Park et al. ...................... | 257/99 |
| 2007/0194333 A1 * | 8/2007 | Son .................................. | 257/88 |
| 2011/0235363 A1 | 9/2011 | An | |
| 2012/0146077 A1 * | 6/2012 | Nakatsu et al. ................. | 257/98 |

FOREIGN PATENT DOCUMENTS

| | | |
|---|---|---|
| JP | H 10-190067 A | 7/1998 |
| JP | 2000-048017 A | 2/2000 |
| JP | 2002-170999 A | 6/2002 |
| JP | 2004-165124 A | 6/2004 |
| JP | 2007-27310 A | 2/2007 |
| JP | 2009-231305 A | 10/2009 |
| KR | 10-0999809 B1 | 12/2010 |

OTHER PUBLICATIONS

Japanese Office Action dated Apr. 22, 2014 with a partial English Translation.
Korean Office Action dated Mar. 18, 2014 with an English Translation.
Korean Office Action dated Jul. 10, 2015 with a partial English translation.

* cited by examiner

*Primary Examiner* — Matthew Reames
(74) *Attorney, Agent, or Firm* — McGinn IP Law Group, PLLC.

(57) ABSTRACT

A light-emitting device includes a substrate, and a plurality of light-emitting elements that are mounted on the substrate and each emit light within a same color region. The plurality of light-emitting elements satisfy at least one of a first condition and a second condition. The first condition is that a maximum deviation in peak wavelength of light emitted from the plurality of light-emitting elements is not less than 1.25 nm. The second condition is that a maximum deviation in threshold voltage of the plurality of light-emitting elements is not less than 0.05 V.

19 Claims, 1 Drawing Sheet

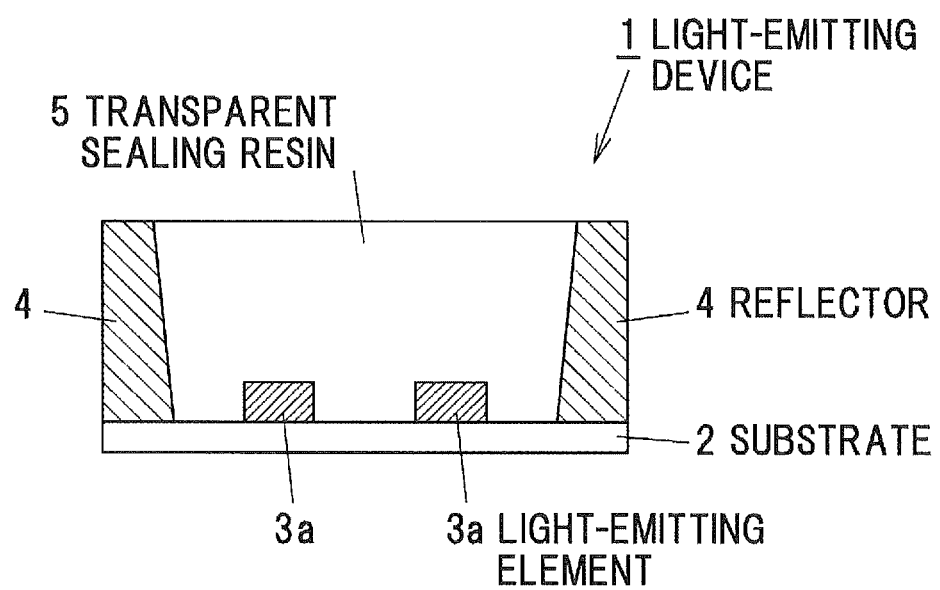

LIGHT-EMITTING DEVICE

The present application is based on Japanese patent application No. 2011-284432 filed on Dec. 26, 2011, the entire contents of which are incorporated herein by reference.

BACKGROUND OF THE INVENTION

1. Field of the Invention

The invention relates to a light-emitting device with plural light-emitting elements.

2. Related Art

Conventionally, a light-emitting device with plural LED chips mounted in one package is known (see, e.g., JP-A-2004-165124).

Also, a light-emitting device collectively using different packages each mounting a blue LED chip with a different peak wavelength is known (see, e.g., JP-A-2007-27310). JP-A-2007-27310 reports that the light-emitting device disclosed therein is adapted such that white light with a high color rendering property can be provided by using the blue LED chip with the different peak wavelength and a phosphor.

SUMMARY OF THE INVENTION

In a light-emitting device with plural LED chips in one package as is the light-emitting device disclosed in JP-A-2004-165124, plural LED chips used therein have generally a substantially equal peak wavelength and threshold voltage. For example, in a light-emitting device whose peak wavelength and threshold voltage are 455 nm and 6 V, respectively, and which uses two LED chips, the two LED chips are connected in series and each have a peak wavelength of 455 nm and a threshold voltage of 3 V.

If the LED chips manufactured have a peak wavelength or a threshold voltage out of the product standards, the LED chips are generally discarded as a defective product. Therefore, the yield of LED chip decreases and the manufacturing cost of light-emitting device increases.

In a light-emitting device having the blue LED chips with different peak wavelengths mounted in different packages as is the light-emitting device disclosed in JP-A-2007-27310, it is difficult to average the emission wavelength and, therefore, a desired emission wavelength is difficult to obtain. Thus, unevenness in emission color is likely to occur when the light-emitting device is closely viewed. In particular, when the package includes a reflector, the unevenness in emission color becomes remarkable since it is more difficult to average the emission wavelength due to the enhanced directivity of light emitted from each package.

Accordingly, it is an object of the invention to provide a light-emitting device that has plural light-emitting elements and the yield of the light-emitting element such as an LED chip can be improved.

It is another object of the invention to provide a light-emitting device that has plural light-emitting elements and unevenness in emission color is less likely to occur even when closely viewed.

(1) According to one embodiment of the invention, a light-emitting device comprises:

a substrate; and a plurality of light-emitting elements that are mounted on the substrate and each emit light within a same color region, wherein the plurality of light-emitting elements satisfy at least one of a first condition and a second condition, wherein the first condition is that a maximum deviation in peak wavelength of light emitted from the plurality of light-emitting elements is not less than 1.25 nm, and wherein the second condition is that a maximum deviation in threshold voltage of the plurality of light-emitting elements is not less than 0.05 V.

In the above embodiment (1) of the invention, the following modifications and changes can be made.

(i) The peak wavelength of lights emitted from the plurality of light-emitting elements is in a range of 380 to 435 nm, 435 to 480 nm, 480 to 500 nm, 500 to 570 nm, 570 to 590 nm, 590 to 620 nm or 620 to 750 nm.

(ii) The light-emitting device further comprises:

a reflector on the substrate to reflect the light emitted from the plurality of light-emitting elements.

(iii) In the first condition the maximum deviation in peak wavelength is not more than 7.5 nm.

(iv) In the first condition the maximum deviation in peak wavelength is not less than 2.5 nm.

(v) In the first condition the maximum deviation in peak wavelength is not less than 3.75 nm.

(vi) In the second condition the maximum deviation in threshold voltage is not more than 0.25 V.

(vii) In the second condition the maximum deviation in threshold voltage is not less than 0.1 V.

(viii) In the second condition the maximum deviation in threshold voltage is not less than 0.2 V.

Effects of the Invention

According to one embodiment of the invention, a light-emitting device can be provided that has plural light-emitting elements and the yield of the light-emitting element such as an LED chip can be improved.

According to another embodiment of the invention, a light-emitting device can be provided that has plural light-emitting elements and unevenness in emission color is less likely to occur even when closely viewed.

BRIEF DESCRIPTION OF THE DRAWINGS

Next, the present invention will be explained in more detail in conjunction with appended drawings, wherein:

FIG. 1 is a vertical cross-sectional view showing a light-emitting device in an embodiment of the present invention.

DESCRIPTION OF THE PREFERRED EMBODIMENTS

Embodiment

FIG. 1 is a vertical cross-sectional view showing a light-emitting device 1 in an embodiment of the invention. The light-emitting device 1 has a substrate 2, light-emitting elements 3a and 3b mounted on the substrate 2, a reflector 4 formed on the substrate 2 so as to surround or sandwich the light-emitting elements 3a and 3b, and a transparent sealing resin 5 filled inside the reflector 4 on the substrate 2 so as to cover the light-emitting elements 3a and 3b.

The substrate 2 is, e.g., a ceramic substrate formed of alumina or aluminum nitride. The substrate 2 has a non-illustrated wiring on a surface or inside thereof. The light-emitting elements 3a and 3b are connected in series by the wiring and voltage is applied through the wiring. Alternatively, a resin composite lead frame having a desired pattern in which a resin is filled between the patterns may be used instead of the substrate 2.

The light-emitting elements 3a and 3b are, e.g., LED chips having a square planar shape. The light-emitting elements 3a and 3b are mounted on the same substrate, i.e., mounted in one package, and emit light within the same color gamut. Peak wavelengths of lights emitted from the light-emitting elements 3a and 3b are both in a range of, e.g., 380 to 435 nm (purple), 435 to 480 nm (blue), 480 to 500 nm (blue-green), 500 to 570 nm (green), 570 to 590 nm (yellow), 590 to 620 nm (orange) or 620 to 750 nm (red).

In addition, the light-emitting elements 3a and 3b satisfy at least one of following conditions: a condition that a maximum deviation of peak wavelength of light emitted therefrom is not less than 1.25 nm (hereinafter, referred to as a "first condition") and a condition that a maximum deviation of threshold voltage is not less than 0.05 V (hereinafter, referred to as a "second condition"). Here, the deviation means a difference between the average value and each individual value. In a conventional manufacturing process of light-emitting device, light-emitting elements which satisfy even any one of the first and second conditions are regarded as being out of the product standard and are generally discarded as defective products.

When the maximum deviation of peak wavelength of the light emitted from the light-emitting elements 3a and 3b is not less than 1.25 nm, and in the case that each of the light-emitting elements 3a and 3b is individually mounted in a package, a difference in emission wavelength may occur between the two packages. However, by using a combination of the light-emitting elements 3a and 3b in one package as is in the present embodiment, it is possible to average emission wavelengths of the light-emitting elements 3a and 3b, thereby obtaining the light-emitting device 1 which emits light with a desired wavelength.

More preferably, the maximum deviation of peak wavelength of the light emitted from the light-emitting elements 3a and 3b is not less than 2.5 nm. In this case, when each of the light-emitting elements 3a and 3b is individually mounted in a package, a difference in emission wavelength is likely to occur between the two packages. However, by using a combination of the light-emitting elements 3a and 3b in one package as is in the present embodiment, it is possible to average emission wavelengths of the light-emitting elements 3a and 3b, thereby obtaining the light-emitting device 1 which emits light with a desired wavelength.

Still more preferably, the maximum deviation of peak wavelength of the light emitted from the light-emitting elements 3a and 3b is not less than 3.75 nm. In this case, when each of the light-emitting elements 3a and 3b is individually mounted in a package, a significant difference in emission wavelength occurs between the two packages. However, by using a combination of the light-emitting elements 3a and 3b in one package as is in the present embodiment, it is possible to average emission wavelengths of the light-emitting elements 3a and 3b, thereby obtaining the light-emitting device 1 which emits light with a desired wavelength.

If the maximum deviation of peak wavelength of the light emitted from the light-emitting elements 3a and 3b is too large, an emission spectrum width of the light-emitting device 1 is broadened and color unevenness occurs in the outgoing light, hence, not more than 7.5 nm is preferable.

When the maximum deviation of threshold voltage of the light-emitting elements 3a and 3b is not less than 0.05 V, and in the case that each of the light-emitting elements 3a and 3b is individually mounted in a package, a difference in power consumption may occur between the two packages. However, by using a combination of the light-emitting elements 3a and 3b in one package as is in the present embodiment, it is possible to obtain the light-emitting device 1 which achieves desired power consumption.

More preferably, the maximum deviation of threshold voltage of light-emitting elements 3a and 3b is not less than 0.1 V. In this case, when each of the light-emitting elements 3a and 3b is individually mounted in a package, a difference in power consumption is likely to occur between the two packages. However, by using a combination of the light-emitting elements 3a and 3b in one package as is in the present embodiment, it is possible to obtain the light-emitting device 1 which achieves desired power consumption.

Still more preferably, the maximum deviation of threshold voltage of the light-emitting elements 3a and 3b is not less than 0.2 V. In this case, when each of the light-emitting elements 3a and 3b is individually mounted in a package, a significant difference in power consumption occurs between the two packages. However, by using a combination of the light-emitting elements 3a and 3b in one package as is in the present embodiment, it is possible to obtain the light-emitting device 1 which achieves desired power consumption.

If the maximum deviation of threshold voltage of the light-emitting elements 3a and 3b is too large, there may be a risk that load is concentrated on one of the elements and reliability of the light-emitting device 1 decreases, hence, not more than 0.25 V is preferable.

The manufacturing of the light-emitting device 1 having a peak wavelength of 455.0 nm (blue light) and threshold voltage of 6 V will be described below as an example.

When the first condition is satisfied, peak wavelengths of the lights emitted from the light-emitting elements 3a and 3b are respectively, e.g., 452.5 nm (blue light) and 457.5 nm (blue light), and 455.0 nm as the average value thereof is a peak wavelength of the light emitted from the light-emitting device 1. In this case, the average peak wavelength of the light emitted from the light-emitting elements 3a and 3b is 455.0 nm and the maximum deviation is 2.5 nm.

Meanwhile, when the second condition is satisfied, threshold voltage of the light-emitting elements 3a and 3b are, e.g., 2.9 V and 3.1 V, and 6 V as the total value thereof is threshold voltage of the light-emitting device 1. In this case, the average threshold voltage of the light-emitting elements 3a and 3b is 3.0 V and the maximum deviation is 0.1 V.

Alternatively, the light-emitting device 1 may include three or more light-emitting elements. In this case, the light-emitting elements emit light within the same color gamut and satisfy at least one of the first and second conditions. In this case, at least one of the light-emitting elements is a non-standard product which would be conventionally discarded as a defective product.

The reflector 4 is formed of, e.g., a white resin and reflects the light emitted from the light-emitting elements 3a and 3b such that directivity is imparted to light emitted from the light-emitting device 1.

The transparent sealing resin 5 is formed of a transparent resin such as silicone resin or epoxy resin. In addition, the transparent sealing resin 5 may contain a particulate phosphor. In this case, emission color of the light-emitting device 1 is a mixture of a color of the light emitted from the light-emitting elements 3a and 3b and exiting to the outside through the transparent sealing resin 5 and a color of the fluorescence produced by the phosphor. For example, when emission color of the light-emitting elements 3a and 3b is blue and that of the phosphor is yellow, emission color of the light-emitting device 1 is white.

Effects of the Embodiment

In the embodiment, by combining, under appropriate conditions, and using light-emitting elements with emission wavelength and threshold voltage out of product standard which would be conventionally discarded, it is possible to obtain a light-emitting device with desired emission wavelength and threshold voltage. Therefore, it is possible to improve a yield of light-emitting element.

Especially when the plural light-emitting elements satisfy both of the first and second conditions, i.e., even when both of emission wavelength and threshold voltage of the light-emitting elements are out of product standard, it is possible to obtain a light-emitting device with desired emission wavelength and threshold voltage. Therefore, when the plural light-emitting elements satisfy both of the first and second conditions, more non-standard light-emitting elements can be used and it is thus possible to further improve a yield of light-emitting element.

It should be noted that the present invention is not intended to be limited to the above-mentioned embodiment, and the various kinds of modifications can be implemented without departing from the gist of the invention.

Also, the invention according to claims is not limited to the above-mentioned embodiment. Further, it should be noted that all combinations of the features described in the embodiment are not necessary to solve the problem of the invention.

What is claimed is:

1. A light-emitting device, comprising:
   a package comprising a single concave portion;
   a plurality of light-emitting elements that are mounted inside the single concave portion of the package and each emits light such that a peak wavelength of the light emitted from said each of the light-emitting elements is in a same range of wavelengths of colors, the plurality of light-emitting elements comprising a first light-emitting element and at least a second light-emitting element;
   a sealing material filled in the single concave portion; and
   a reflector disposed on the package to reflect the light emitted from the plurality of light-emitting elements, in a cross-sectional-view, the single concave portion extending between adjacent side surfaces of the reflector such that, in the cross-sectional view, said each of the light-emitting elements is disposed between said adjacent side surfaces of the reflector,
   wherein the plurality of light-emitting elements satisfy at least one of a first condition and a second condition,
   wherein the first condition is that a maximum deviation in a peak wavelength of light emitted from the plurality of light-emitting elements is not less than 1.25 nm, such that a mean value of a peak wavelength of light emitted from the first light-emitting element is greater than a mean value of the peak wavelength of the light emitted from the plurality of light-emitting elements not less than 1.25 nm, and a mean value of a peak wavelength of light emitted from the at least second light-emitting element is less than the mean value of the peak wavelength of the plurality of light-emitting elements not less than 1.25 nm, and
   wherein the second condition is that a maximum deviation in threshold voltage of the plurality of light-emitting elements is not less than 0.05 V, such that a mean value of a threshold voltage of the first light-emitting element is greater than a mean value of the threshold voltage of the plurality of light-emitting elements not less than 0.05 V, and a mean value of a threshold voltage of the at least second light-emitting element is less than the mean value of the threshold voltage of the plurality of light-emitting elements not less than 0.05 V.

2. The light-emitting device according to claim 1, wherein the peak wavelength of light emitted from the plurality of light-emitting elements is in a range of 380 nm to 435 nm, 435 nm to 480 nm, 480 nm to 500 nm, 500 nm to 570 nm, 570 nm to 590 nm, 590 nm to 620 nm, or 620 nm to 750 nm.

3. The light-emitting device according to claim 1, wherein in the first condition the maximum deviation in the peak wavelength is not more than 7.5 nm.

4. The light-emitting device according to claim 1, wherein in the first condition the maximum deviation in the peak wavelength is not less than 2.5 nm.

5. The light-emitting device according to claim 1, wherein in the first condition the maximum deviation in the peak wavelength is not less than 3.75 nm.

6. The light-emitting device according to claim 1, wherein in the second condition the maximum deviation in the threshold voltage is not more than 0.25 V.

7. The light-emitting device according to claim 1, wherein in the second condition the maximum deviation in the threshold voltage is not less than 0.1 V.

8. The light-emitting device according to claim 1, wherein in the second condition the maximum deviation in the threshold voltage is not less than 0.2 V.

9. The light-emitting device according to claim 4, wherein in the first condition the maximum deviation in the peak wavelength is not more than 7.5 nm.

10. The light-emitting device according to claim 8, wherein in the second condition the maximum deviation in the threshold voltage is not more than 0.25 V.

11. The light-emitting device according to claim 1, wherein the maximum deviation in the peak wavelength is defined as a difference between an average value of the peak wavelength of the light emitted from the plurality of light-emitting elements and a value of the peak wavelength of light emitted from said each of the plurality of light-emitting elements.

12. The light-emitting device according to claim 1, wherein the light-emitting device comprises a combination of the light-emitting elements in the package.

13. The light-emitting device according to claim 1, wherein the plurality of light-emitting elements satisfy the first condition and the second condition.

14. The light-emitting device according to claim 1, wherein the sealing material comprises a transparent resin filling an area between the side surfaces of the reflector on the package, the transparent resin being disposed on the side surfaces of the reflector, and side surfaces and an upper surface of said each one of the light-emitting elements, the side surfaces of the reflector sandwiching the plurality of light-emitting elements in the single concave portion.

15. A light-emitting device, comprising:
   a package comprising a single concave portion;
   a plurality of light-emitting elements that are mounted inside the single concave portion of the package and each emits light such that a peak wavelength of the light emitted from said each of the light-emitting elements is in a same range of wavelengths of colors, the plurality of light-emitting elements comprising a first light-emitting element and at least a second light-emitting element;
   a sealing material filled in the single concave portion; and
   a reflector disposed on the package to reflect the light emitted from the plurality of light-emitting elements, in a cross-sectional view, the single concave portion extending between adjacent side surfaces of the reflector such that, in the cross-sectional view, said each of the light-emitting elements is disposed between said adjacent side surfaces of the reflector,
   wherein the plurality of light-emitting elements satisfy a condition that a maximum deviation in a peak wavelength of light emitted from the plurality of light-emitting elements is not less than 1.25 nm, such that a mean value of a peak wavelength of the light emitted from the first light-emitting element is greater than a mean value of the peak wavelength of the light emitted from the plurality of light-emitting elements not less than 1.25 nm, and a mean value of a peak wavelength of light emitted from the at least second light-emitting element is less than the mean value of the peak wavelength of the light emitted from the plurality of light-emitting elements not less than 1.25 nm.

16. The light-emitting device according to claim 15, wherein the plurality of light-emitting elements further satisfy another condition that a maximum deviation in a threshold voltage of the plurality of light-emitting elements is not less than 0.05 V, and
   wherein the maximum deviation in the peak wavelength is defined as a difference between an average value of the peak wavelength of the light emitted from the plurality of light-emitting elements and a value of the peak wavelength of light emitted from said one of the plurality of light-emitting elements.

17. The light-emitting device according to claim 15, wherein the sealing material comprises a transparent resin filling an area between the side surfaces of the reflector on the package, the transparent resin being disposed on the side surfaces of the reflector, and side surfaces and an upper surface of said each one of the light-emitting elements, the side surfaces of the reflector sandwiching the plurality of light-emitting elements in the single concave portion,
   wherein the light-emitting device comprises a combination of the light-emitting elements in the package.

18. A light-emitting device, comprising:
   a package comprising a single concave portion;
   a plurality of light-emitting elements that are mounted inside the single concave portion of the package and each emits light such that a peak wavelength of the light emitted from said each of the light-emitting elements is in a same range of wavelengths of colors, the plurality of light-emitting elements comprising a first light-emitting element and at least a second light-emitting element;
   a sealing material filled in the single concave portion; and
   a reflector disposed on the package to reflect the light emitted from the plurality of light-emitting elements, in a cross-sectional view, the single concave portion extending between adjacent side surfaces of the reflector,
   wherein the plurality of light-emitting elements satisfy at least one of a first condition and a second condition,
   wherein the first condition is that a maximum deviation in a peak wavelength of light emitted from the plurality of light-emitting elements is not less than 1.25 nm, such that a mean value of a peak wavelength of light emitted from the first light-emitting element is greater than a mean value of the peak wavelength of the light emitted from the plurality of light-emitting elements not less than 1.25 nm, and a mean value of a peak wavelength of light emitted from the at least second light-emitting element is less than the mean value of the peak wavelength of the light emitted from the plurality of light-emitting elements not less than 1.25 nm,
   wherein the second condition is that a maximum deviation in threshold voltage of the plurality of light-emitting elements is not less than 0.05 V, such that a mean value of a threshold voltage of the first light-emitting element is greater than a mean value of the threshold voltage of the plurality of light-emitting elements not less than 0.05 V, and a mean value of a threshold voltage of the at least second light-emitting element is less than the mean value of the threshold voltage of the plurality of light-emitting elements not less than 0.05 V, and
   wherein said each of the light-emitting elements comprises a light-emitting diode.

19. The light-emitting device according to claim 1, wherein, in the cross-sectional view, the sealing material continuously extends above upper surfaces of the light-emitting elements and between said adjacent side surfaces of the reflector.

* * * * *